(12) United States Patent
Cho et al.

US007180154B2

(10) Patent No.: US 7,180,154 B2
(45) Date of Patent: Feb. 20, 2007

(54) INTEGRATED CIRCUIT DEVICES HAVING CORROSION RESISTANT FUSE REGIONS AND METHODS OF FABRICATING THE SAME

(75) Inventors: Tai-Heui Cho, Gyeonggi-do (KR); Hyuck-Jin Kang, Seoul (KR); Heui-Won Shin, Seocho-gu (KR); Gwang-Seon Byun, Gyeonggi-do (KR); Sun-Joon Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 33 days.

(21) Appl. No.: 10/845,048

(22) Filed: May 13, 2004

(65) Prior Publication Data

US 2004/0262768 A1 Dec. 30, 2004

(30) Foreign Application Priority Data

Jun. 24, 2003 (KR) ...................... 10-2003-0041249

(51) Int. Cl.
*H01L 29/00* (2006.01)
(52) U.S. Cl. ...................... 257/529; 257/758; 257/87; 257/103; 438/132; 438/601
(58) Field of Classification Search ................ 257/209, 257/529, 530; 438/132, 601
See application file for complete search history.

(56) References Cited

U.S. PATENT DOCUMENTS 5,618,750 A * 4/1997 Fukuhara et al. ........... 438/601
5,760,453 A * 6/1998 Chen .......................... 257/529
6,054,339 A * 4/2000 Gilmour et al. ............ 438/132
6,100,118 A * 8/2000 Shih et al. .................. 438/132
6,444,544 B1 * 9/2002 Hu et al. ..................... 438/467
6,509,255 B2 * 1/2003 Minn et al. ................. 438/601
6,521,971 B2 * 2/2003 Tsai ............................ 257/529
6,525,398 B1 * 2/2003 Kim et al. ................... 257/529
6,531,757 B2 * 3/2003 Shiratake .................... 257/529
6,566,735 B1 * 5/2003 Minn et al. ................. 257/620
6,897,110 B1 * 5/2005 He et al. ..................... 438/257

OTHER PUBLICATIONS

Taiwan Intellectual Property Office, "Preliminary Notice of the First Office Action" corresponding to Taiwan Patent application 93116292, mailed Sep. 15, 2005.

* cited by examiner

*Primary Examiner*—Anh D. Mai
*Assistant Examiner*—Brian E. Kunzer
(74) *Attorney, Agent, or Firm*—Myers Bigel Sibley & Sajovec

(57) ABSTRACT

Integrated circuit devices are provided including an integrated circuit substrate and first through fourth spaced apart lower interconnects on the integrated circuit substrate. The third and fourth spaced apart lower interconnects are parallel to the first and second lower interconnects. A first fuse is provided on the first and second lower interconnects between the first and second lower interconnects and is electrically coupled to the first and second lower interconnects. A second fuse is provided spaced apart from the first fuse and on the third and fourth lower interconnects. The second fuse is between the third and fourth lower interconnects and is electrically coupled to the third and fourth lower interconnects. Related methods of fabricating integrated circuit devices are also provided.

10 Claims, 13 Drawing Sheets

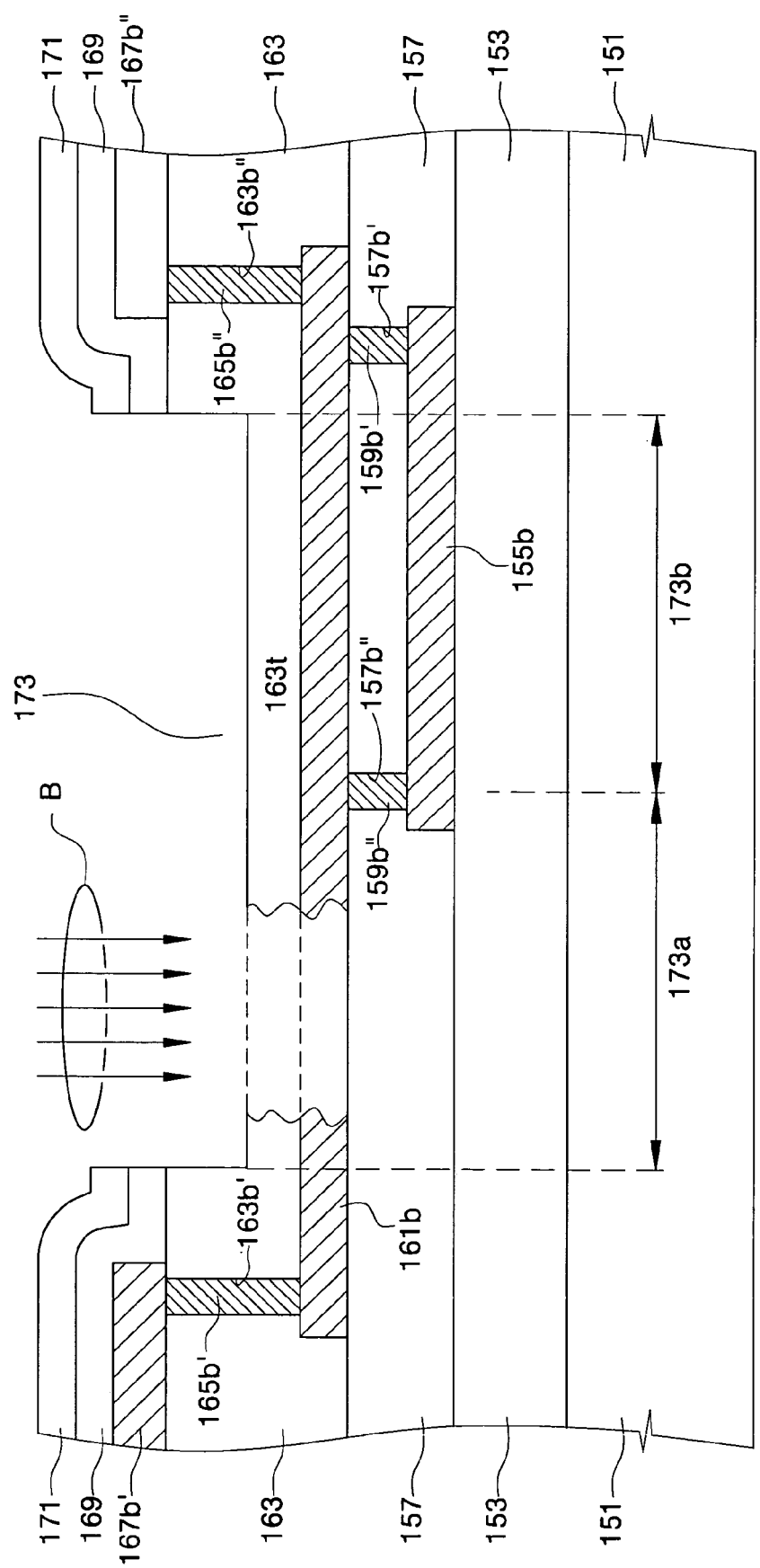

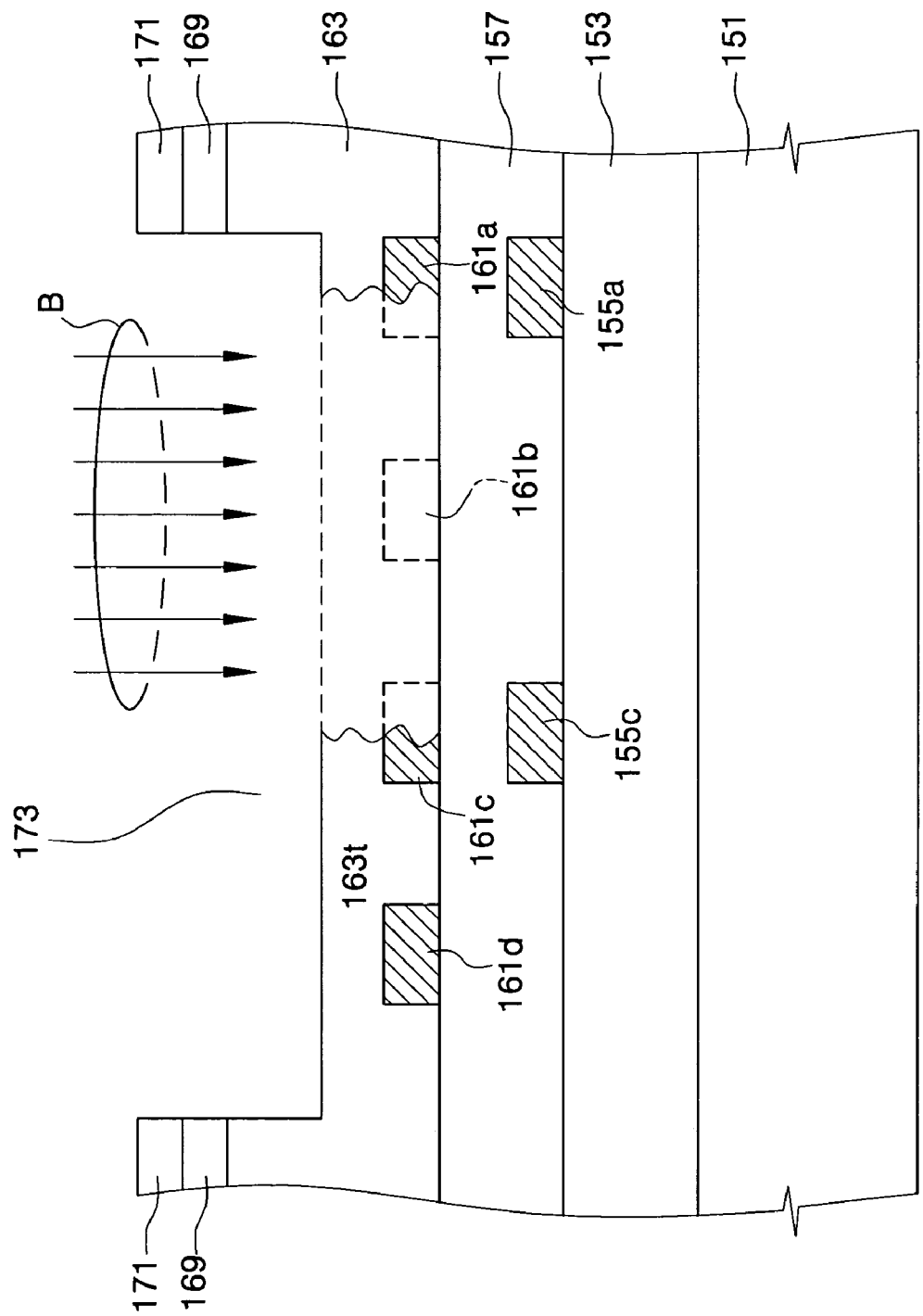

INTEGRATED CIRCUIT DEVICES HAVING CORROSION RESISTANT FUSE REGIONS AND METHODS OF FABRICATING THE SAME

CROSS REFERENCE TO RELATED APPLICATION

This application is related to and claims priority from Korean Patent Application No. 2003-41249, filed on Jun. 24, 2003, the disclosure of which is hereby incorporated herein by reference as if set forth in its entirety.

FIELD OF THE INVENTION

The present invention relates to integrated circuit devices and methods of fabricating the same and, more particularly, to integrated circuit devices having fuse regions and methods of fabricating the same.

BACKGROUND OF THE INVENTION

Integrated circuit memory devices provided on an integrated circuit substrate are typically tested prior to assembly of the memory device. During this process, the integrated circuit memory devices may be classified as either good or bad. If a chip classified as bad malfunctions due to one or more failed cells, the failed cell(s) may be replaced by a redundant cell already included in the memory device. The repair process may include irradiating a laser-beam used to blow one or more fuses. Blowing the fuse(s) allows the redundant cell to have the same address as the failed cell in write/read modes. Generally, fuses are formed simultaneously with bit lines of the integrated circuit memory device. In other words, the fuses and the bit lines may be simultaneously formed using a single step of, for example, a photolithography/etching process. In some integrated circuit devices, the bit lines may be formed of a metal material such as tungsten in order to reduce the electrical resistance of the bit line. Thus, the fuses may also include a metal material.

Referring to FIGS. 1A and 1B, a top plan view illustrating a portion of a conventional fuse region and a cross section taken along the line I–I' of FIG. 1A, respectively, will be discussed. A lower interlayer insulating layer 3 is provided on a surface of an integrated circuit substrate 1. A fuse 5 is provided on the lower interlayer insulating layer 3. The fuse 5 includes first and second parallel sub fuses 5a and 5b as well as a fuse connection 5c that connects a first end of the first sub fuse 5a to a first end of the second sub fuse 5b. The first and second sub fuses 5a and 5b and the fuse connection 5c may be formed by patterning a metal layer, such as a tungsten layer, using a single photolithography/etching process. As a result, the first and second sub fuses 5a and 5b and the fuse connection 5c may be formed of the same layer of metal. An upper interlayer insulating layer 7 is provided on the fuse 5. A second end of the first sub fuse 5a and a second end of the second sub fuse 5b are exposed by a first contact hole 7a and a second contact hole 7b, respectively, that penetrate the upper interlayer insulating layer 7, and the fuse connection 5c is exposed by a third contact hole 7c that penetrates the upper interlayer insulating layer 7.

A first contact plug 9a (FIG. 1), a second contact plug 9b, and a third contact plug 9c may be provided in the first, second, and third contact holes 7a, 7b, 7c, respectively. A first metal interconnect 11a, a second metal interconnect 11b and a third metal interconnect 11c are provided on the upper interlayer insulating layer 7. The first metal interconnect 11a is electrically coupled to the first contact plug 9a, and the second metal interconnect 11b is electrically coupled to the second contact plug 9b. In addition, the third metal interconnect 11c is electrically coupled to the third contact plug 9c. Thus, the first and third metal interconnects 11a and 11c are electrically coupled through the first sub fuse 5a, and the second and third metal interconnects 11b and 11c are electrically coupled through the second sub fuse 5b. A passivation layer 13 is provided on the first to third metal interconnects 11a, 11b and 11c. A fuse window 13a is provided inside the passivation layer 13 and the upper interlayer insulating layer 7. The fuse window 13a is provided on the first and second sub fuses 5a and 5b. An interlayer insulating layer 7t, which is thinner than the initial upper interlayer insulating layer 7, may be provided on the first and second sub fuses 5a and 5b.

If one of the first and second sub fuses 5a and 5b, for example, the second sub fuse 5b is blown by, for example, a laser beam penetrating the fuse window 13a, during a repair process, the cut (blown) region of the second sub fuse 5b may be exposed to the atmosphere. After the repair process, the integrated circuit substrate including the fuse 5 may be encapsulated through an assembly process. However, the cut (blown) sub fuse 5b may be exposed to the moisture of the atmosphere or a subsequent wet process, such as a cleaning process, prior to the assembly process. Accordingly, the first sub fuse 5a may be corroded by moisture that may penetrate through the cut second sub fuse 5b and the fuse connection 5c. As a result, the first metal interconnect 11a may be electrically disconnected from the third metal interconnect 11c, which may cause the integrated circuit device to malfunction.

Furthermore, a laser beam used to blow (cut) tungsten fuses typically has higher energy than a laser beam used to blow polysilicon fuses or tungsten silicide fuses. As integrated circuit memory devices become more highly integrated, a pitch size of the fuses may also be reduced. Therefore, when a desired fuse is selectively blown, a non-selected fuse adjacent to the selected fuse may be damaged or cut due to the high energy laser beam and/or the smaller pitch size.

The damaged or cut tungsten fuse may be exposed to the atmosphere after the repair process. Thus, the damaged or cut tungsten fuse may be easily corroded due to moisture in the atmosphere, thereby possibly causing the integrated circuit device to malfunction. In particular, the tungsten layer may have a relatively strong oxidation characteristic relative to the polysilicon layer and the tungsten silicide layer. Hence, the damaged or cut tungsten fuse may lead to a remarkable reduction of a post-repair yield of an integrated circuit device.

A method of fabricating fuse regions that addresses some of the problems discussed above is provided in U.S. Pat. No. 5,618,750 to Fukuhara, et al. As stated therein, first, second and third interconnects are provided spaced apart on an integrated circuit substrate. The second and third interconnects are parallel to each other and are perpendicular to the first interconnects. The first to third interconnects are formed of a non-corrosive material layer. A first fuse is provided over a region between the first and second interconnects, and a second fuse is provided over a region between the first and third interconnects. First and second ends of the first fuse are electrically coupled to the first and second interconnects, respectively, and first and second ends of the second fuse are electrically coupled to the first and third interconnects, respectively. Accordingly, even if one of the fuses may be blown and moisture may penetrate through the blown region, the other fuse adjacent to the blown fuse may not be corroded due to the fact that the first interconnect includes a non-corrosive material layer. In other words, the first and third interconnects may act as corrosion stop layers.

SUMMARY OF THE INVENTION

Embodiments of the present invention provide integrated circuit devices including an integrated circuit substrate and first through fourth spaced apart lower interconnects on the integrated circuit substrate. The third and fourth spaced apart lower interconnects are parallel to the first and second lower interconnects. A first fuse is provided on the first and second lower interconnects between the first and second lower interconnects and is electrically coupled to the first and second lower interconnects. A second fuse is provided spaced apart from the first fuse and on the third and fourth lower interconnects. The second fuse is between the third and fourth lower interconnects and is electrically coupled to the third and fourth lower interconnects.

In some embodiments of the present invention, the integrated circuit device may further includes first, second and third intermediate interconnects on the integrated circuit substrate. The surfaces of the first, second and third intermediate interconnects may have surfaces that are substantially planar with surfaces of the first and second fuses. The first intermediate interconnect may be on the first lower interconnect and may be electrically coupled to the first lower interconnect. The second intermediate interconnect may be on the second and fourth lower interconnects and may be electrically coupled to the second and fourth lower interconnects. The third intermediate interconnect may be on the third lower interconnect and may be electrically coupled to the third lower interconnect.

In further embodiments of the present invention, the integrated circuit device may further include first, second and third lower metal interconnects on the first, second and third intermediate interconnects, respectively. The first, second and third lower metal interconnects may be electrically coupled to the first, second and third intermediate interconnects, respectively.

In still further embodiments of the present invention, the integrated circuit device may further include a fuse guard ring on the integrated circuit substrate that surrounds the first and second fuses. The fuse guard ring may include an intermediate interconnect guard ring between the first and second fuses and the first, second and third intermediate interconnects. A first metal guard ring plug may be provided on the intermediate interconnect guard ring. A first metal guard ring may be provided on the first metal guard ring plug and a second metal guard ring plug may be provided on the first metal guard ring. A second metal guard ring may be provided on the second metal guard ring plug.

In some embodiments of the present invention, the integrated circuit device may further include first, second, third and fourth fuse contact plugs. The first fuse may be electrically coupled to the first and second lower interconnects through the first and second fuse contact plugs. The second fuse may be electrically coupled to the third and fourth lower interconnects through the third and fourth fuse contact plugs.

In further embodiments of the present invention, the first, second, third and fourth fuse contact plugs may include a barrier metal layer and a metal plug layer on the barrier metal layer. The barrier metal layer may include a titanium nitride layer. The first, second, third and fourth lower interconnects may include non-corrosive material layers and the non-corrosive material layers may include a polysilicon layer and/or a polycide layer. The first, second and third intermediate interconnects and the first and second fuses may include tungsten layers.

Still further embodiments of the present invention provide a fuse region including an integrated circuit substrate and a plurality of spaced apart fuses on the integrated circuit substrate. A fuse guard ring is provided on the integrated circuit substrate and surrounds the plurality of fuses.

In some embodiments of the present invention, the fuse guard ring may include an intermediate interconnect guard ring including a surface that is substantially planar to surfaces of the plurality of fuse regions. A first metal guard ring plug may be provided on the intermediate interconnect guard ring. The first metal guard ring may be provided on the first metal guard ring plug. A second metal guard ring plug may be provided on the first metal guard ring and a second metal guard ring may be provided on the second metal guard ring plug.

Further embodiments of the present invention provide an integrated circuit device including an integrated circuit substrate—having first and second regions. A lower interlayer insulating layer is provided on the integrated circuit substrate and a plurality of parallel lower interconnects are provided on the integrated circuit substrate. Odd-numbered ones of the plurality lower interconnects are in the first region of the integrated circuit substrate and even-numbered ones of the plurality of lower interconnects are in the second region of the integrated circuit substrate. A plurality of parallel fuses are provided on the plurality of lower interconnects. Even-numbered ones of the plurality of fuses are in the first region of the integrated circuit substrate and are electrically coupled to respective even-numbered ones of the plurality of lower interconnects. Odd-numbered ones of the plurality of fuses are in the second region of the integrated circuit substrate and are electrically coupled to respective odd-numbered ones of the plurality of lower interconnects. A plurality of upper interconnects are provided on the plurality of parallel fuses. A first group of the plurality of upper interconnects are electrically coupled to the odd-numbered ones of the plurality of lower interconnects and the even-numbered ones of the plurality of fuses. A second group of the plurality of upper interconnects are electrically coupled to the even-numbered ones of the plurality of lower interconnects and to the odd-numbered ones of the plurality of fuses.

In still further embodiments of the present invention, the integrated circuit device may further include an intermediate insulating layer on the plurality of lower interconnects and an upper insulating layer on the plurality of fuses. A plurality of odd-numbered intermediate interconnects may be provided on the odd numbered ones of the plurality of lower interconnects that are adjacent to the first region of the integrated circuit substrate. The plurality of odd-numbered intermediate interconnects may be interposed between the intermediate interlayer insulating layer and the upper interlayer insulating layer. A plurality of even-numbered intermediate interconnects may be provided on the even numbered ones of the plurality of lower interconnects that are adjacent to the second region. The plurality of even-numbered intermediate interconnects may be interposed between the intermediate interlayer insulating layer and the upper interlayer insulating layer. The odd-numbered ones of the plurality of upper interconnects may be electrically coupled to the plurality of odd-numbered lower interconnects through the plurality of odd-numbered intermediate interconnects. The even-numbered ones of the plurality of upper interconnects may be electrically coupled to the plurality of even-numbered lower interconnects through the plurality of even-numbered intermediate interconnects.

In some embodiments of the present invention, the plurality of odd-numbered intermediate interconnects, the plurality of even-numbered intermediate interconnects and the plurality of fuses may include the same material layer. The first group of upper interconnects may be adjacent to the first region of the integrated circuit substrate and opposite the second region of the integrated circuit substrate. The second group of upper interconnects may be adjacent to the second region of the integrated circuit substrate and opposite the first region of the integrated circuit substrate.

In further embodiments of the present invention, the even-numbered ones of the plurality of fuses may be provided on extension lines of the even-numbered ones of the plurality of lower interconnects. The odd-numbered ones of the plurality of fuses may be provided on extension lines of the odd-numbered ones of the plurality of lower interconnects. The plurality of lower interconnects may include non-corrosive material layers. The non-corrosive material layer may include a polysilicon layer and/or a tungsten polycide layer. The plurality of fuses may include tungsten layers.

Still further embodiments of the present invention provide an integrated circuit device having first and second regions. The integrated circuit device further includes a plurality of parallel lower interconnects. Odd-numbered ones of the plurality of lower interconnects are in the first region of the integrated circuit substrate and even-numbered ones of the plurality of lower interconnects are in the second region of the integrated circuit substrate. A plurality of fuses is provided on the first and second regions of the integrated circuit substrate. The plurality of fuses have overlap portions with the plurality of lower interconnects. A plurality of upper interconnects is provided. A first group of the plurality of upper interconnects is electrically coupled to ends of ones of the plurality of fuses adjacent to the first region of the integrated circuit substrate. A second group of the plurality of upper interconnects is electrically coupled to ends of ones of the plurality of fuses adjacent to the second region of the integrated circuit substrate. Ends of the overlap portions of the plurality of fuses are electrically coupled to ends of the plurality of lower interconnects thereunder.

In some embodiments of the present invention, the plurality of lower interconnects may include non-corrosive material layers. The non-corrosive material layer may include a polysilicon layer and/or a polycide layer. The plurality of fuses may include tungsten layers.

While the present invention is described above primarily with reference to integrated circuit devices and fuse regions, methods of fabricating integrated circuit devices and fuse regions are also provided herein.

BRIEF DESCRIPTION OF THE DRAWINGS

FIG. 11 is a cross section taken along the line V–V' of FIG. 10 illustrating fuse regions according to some embodiments of the present invention.

FIG. 12 is a cross section taken along the line VI–VI' of FIG. 10 illustrating fuse regions according to further embodiments of the present invention.

DETAILED DESCRIPTION OF EMBODIMENTS OF THE PRESENT INVENTION

Figure 1A:
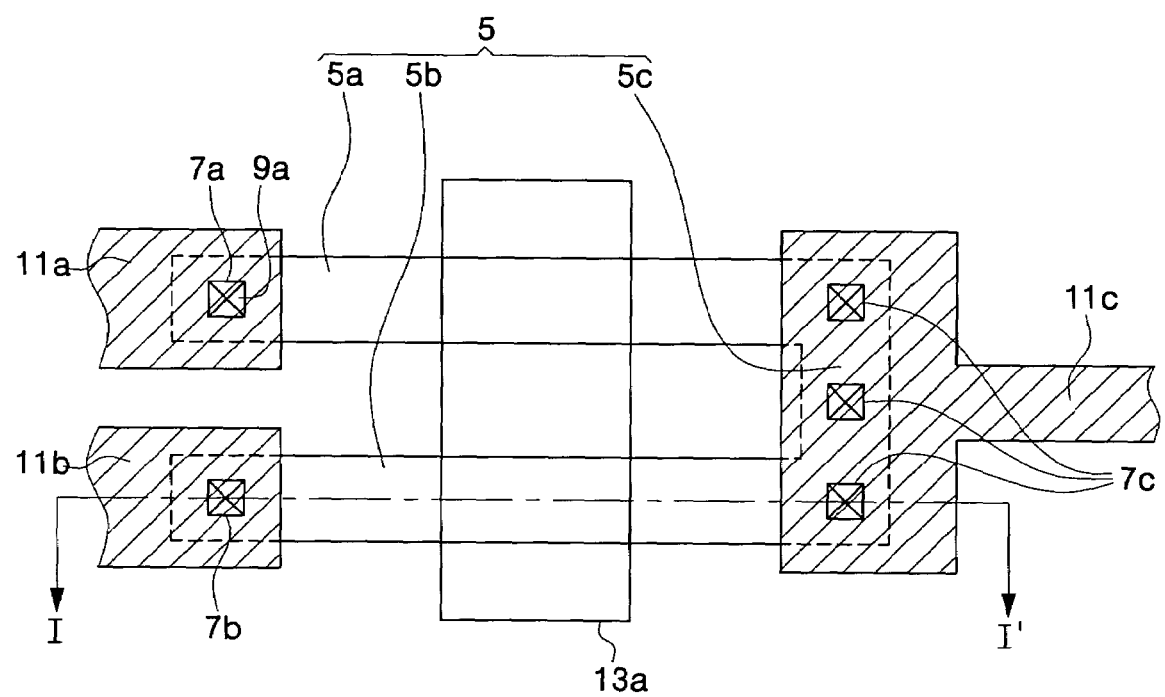
FIG. 1A is a top plan view illustrating conventional fuse regions.
Figure 1B:
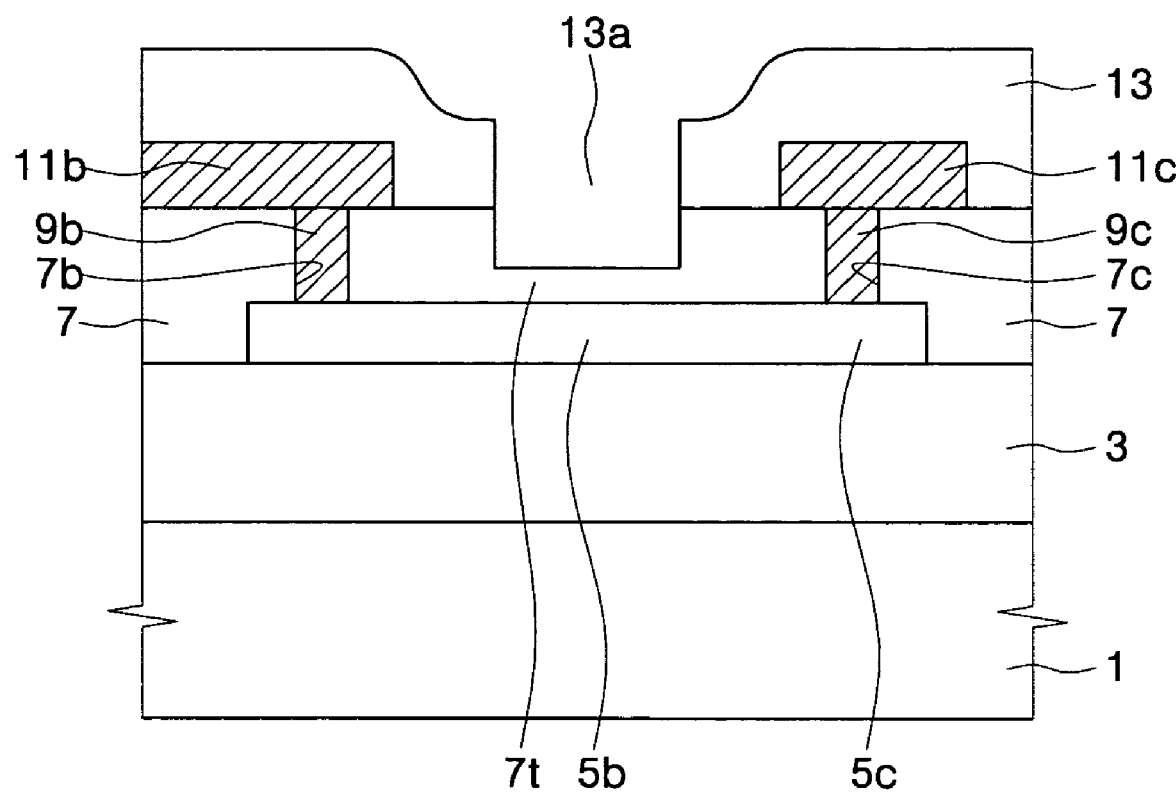
FIG. 1B is a cross sectional view taken along the line I–I' of FIG. 1A illustrating conventional fuse regions.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

Relative terms, such as "lower" and "upper", may be used herein to describe one elements relationship to another elements as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompasses both an orientation of lower and upper, depending of the particular orientation of the figure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 2:
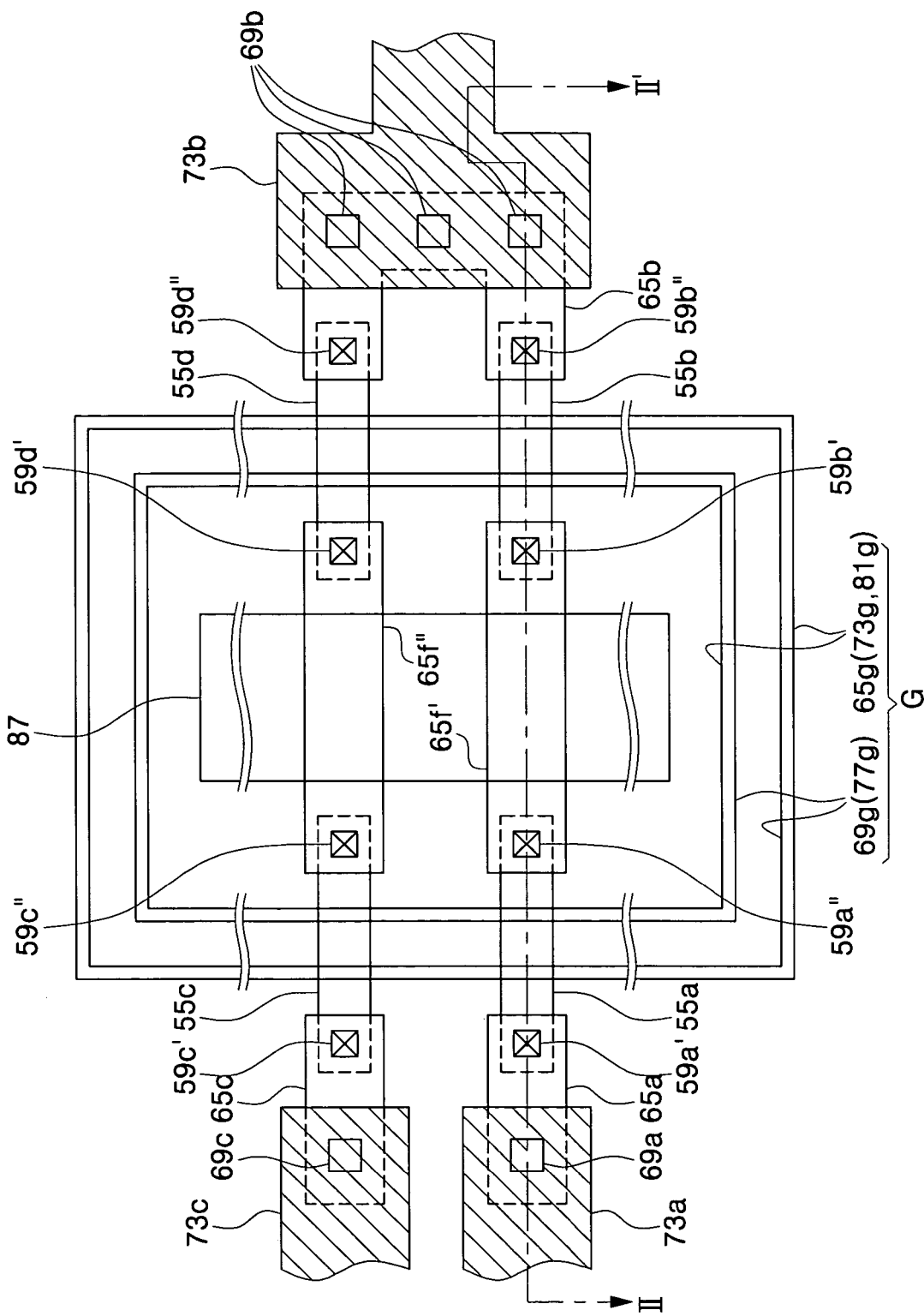
FIG. 2 is a top plan view illustrating fuse regions according to some embodiments of the present invention.

Embodiments of the present invention will be described below with respect to FIGS. 2 through 11. FIG. 2 illustrates a top plan view illustrating fuse regions according to some embodiments of the present invention. FIGS. 3 to 6 are cross sections taken along the line II–II' of FIG. 2 illustrating processing steps in the fabrication of fuse regions according to some embodiments of the present invention.

Figure 6:
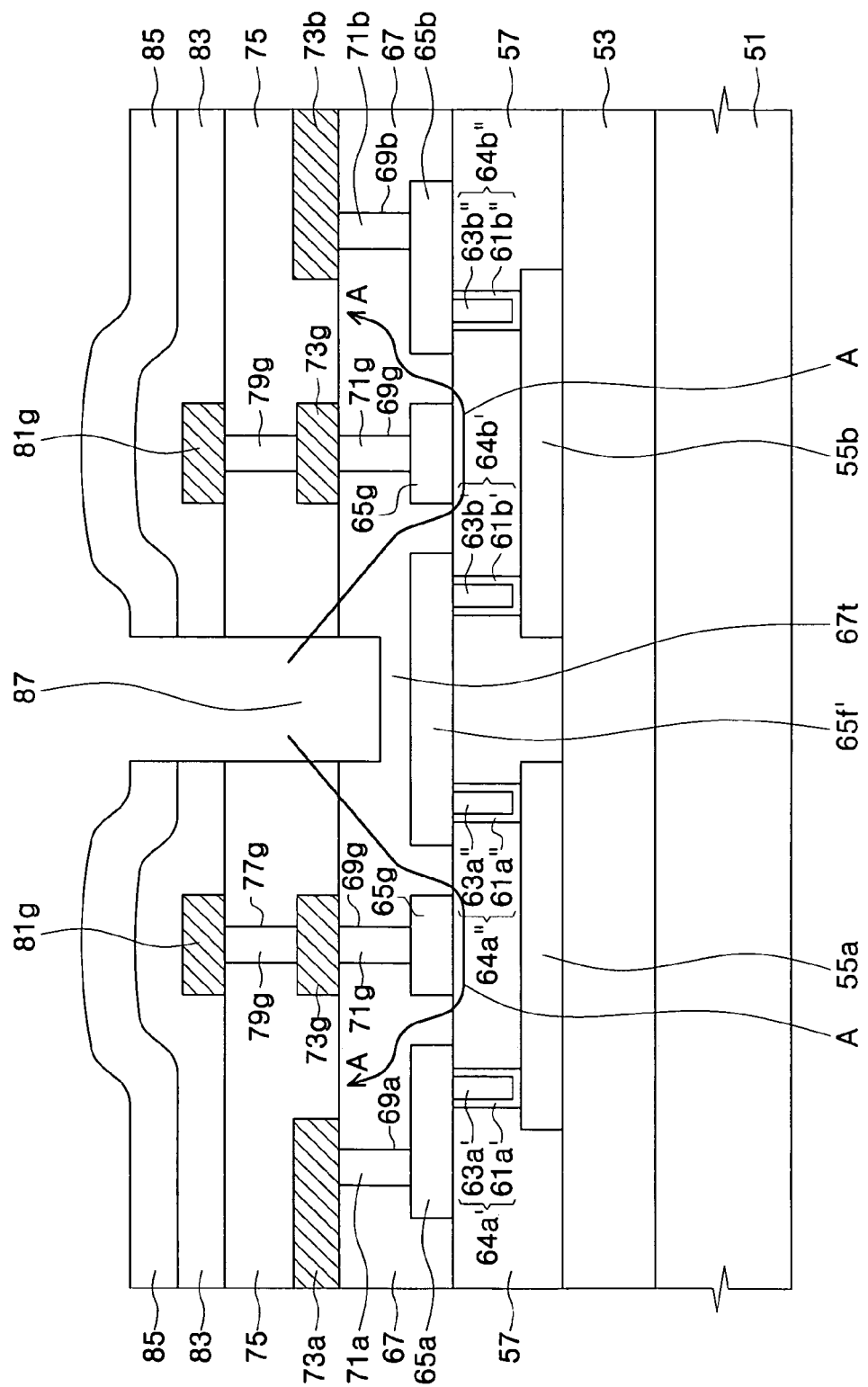

Referring now to FIGS. 2 and 6, fuse regions according to some embodiments of the present invention will be discussed. An insulating layer 53 is provided on a surface of an integrated circuit substrate 51. The insulating layer 53 may be, for example, a device isolation layer. First, second, third and fourth lower interconnects 55a, 55b, 55c and 55d are provided on the insulating layer 53. The first and second lower interconnects 55a and 55b are provided in a first straight line and are spaced apart from each other. Similarly, the third and fourth lower interconnects 55c and 55d are provided in a second straight line, parallel to the first straight line, and spaced apart from each other. The third lower interconnect 55c is adjacent to the first lower interconnect 55a, and the fourth lower interconnect 55d is placed to be adjacent to the second lower interconnect 55b. In some embodiments of the present invention, the first, second, third and fourth lower interconnects 55a, 55b, 55c and 55d may include a non-corrosive material layer. The non-corrosive material layer may be, for example, a polysilicon layer and/or a polycide layer. In certain embodiments of the present invention, the lower interconnects 55a, 55b, 55c and 55d may be conductive layers, for example, gate electrodes of metal oxide semiconductor (MOS) transistors or word lines of a cell array region.

A lower interlayer insulating layer 57 is provided on the lower interconnects 55a, 55b, 55c and 55d and the insulating layer 53. Ends of the first, second, third and fourth lower interconnects 55a, 55b, 55c and 55d are exposed by fuse contact holes 59a', 59a", 59b', 59b", 59c', 59c", 59d' and 59d" that penetrate the lower interlayer insulating layer 57. First, second and third intermediate interconnects 65a, 65b and 65c and first and second fuses 65f' and 65f" are provided on the lower interlayer insulating layer 57. The first fuse 65f' is electrically coupled to the first and second lower interconnects 55a and 55b through the fuse contact holes 59a" and 59b', respectively. Similarly, the second fuse 65f" is electrically coupled to the third and fourth lower interconnects 55c and 55d through the fuse contact holes 59c" and 59d', respectively. Accordingly, the first fuse 65f' is provided on the region between the first and second lower interconnects 55a and 55b, and the second fuse 65f" is provided on the region between the third and fourth lower interconnects 55c and 55d.

The first intermediate interconnect 65a is electrically coupled to the first lower interconnect 55a through the fuse contact hole 59a', and the third intermediate interconnect 65c is electrically coupled to the third lower interconnect 55c through the fuse contact hole 59c'. The first and third intermediate interconnects 65a and 65c are located opposite the first and second fuses 65f' and 65f", respectively. The second intermediate interconnect 65b is electrically coupled to the second and fourth lower interconnects 55b and 55d through the fuse contact holes 59b" and 59d", respectively. The second intermediate interconnect 65b is located opposite the first and second fuses 65f' and 65f". The first, second and third intermediate interconnects 65a, 65b and 65c and the first and second fuses 65f' and 65f" may include, for example, a metal layer such as a tungsten layer. It will be understood that tungsten is a corrosive material and may be vulnerable to moisture.

Fuse contact plugs 64a', 64a", 64b' and 64d" of FIG. 6 may be provided in the fuse contact holes 59a', 59a", 59b', 59b", 59c', 59c", 59d' and 59d". The fuse contact plugs may include a conformal barrier metal layer 61a', 61a", 61b', 61b" and a metal plug layer 63a', 63a", 63b', 63b" on the barrier metal layer 61a', 61a", 61b', 61b". In some embodiments of the present invention, the barrier metal layer may be a non-corrosive material layer such as a titanium nitride layer and the metal plug layer may be a tungsten layer. Furthermore, the fuse contact plugs may include a polysilicon layer.

The first and second fuses 65f' and 65f" may be surrounded by an intermediate interconnect guard ring 65g as illustrated in FIG. 2. The intermediate interconnect guard ring 65g may be provided such that is passes through a region between the first and second fuses 65f' and 65f" and the intermediate interconnects 65a, 65b and 65c. An upper surface of the intermediate interconnect guard ring 65g may be substantially planar with upper surfaces of the first and second fuses 65f' and 6Sf".

An upper interlayer insulating layer 67 may be provided on the integrated circuit substrate including first and second fuses 65f' and 65f" and the intermediate interconnects 65a, 65b and 65c. The upper interlayer insulating layer 67 may be, for example, a borophosphosilicate glass (BPSG) layer. The BPSG layer may have strong moisture absorbance characteristics. The first to third intermediate interconnects 65a, 65b and 65c may be exposed by first metal contact holes (69*a*, 69*b* and 69*c* of FIG. 2) that penetrate the upper interlayer insulating layer 67. In addition, the intermediate interconnect guard ring 65*g* may also be exposed by a first metal guard ring contact hole (69*g* of FIG. 2) that penetrates the upper interlayer insulating layer 67. The first metal contact holes 69*a*, 69*b* and 69*c* and the first metal guard ring contact hole 69*g* may be filled with first metal contact plugs 71*a*, 71*b* and 71*c* and a first metal guard ring plug 71*g*, respectively.

First, second and third lower metal interconnects 73*a*, 73*b* and 73*c* are provided on the upper interlayer insulating layer 67. The first, second and third lower metal interconnects 73*a*, 73*b* and 73*c* are electrically coupled to the first, second and third intermediate interconnects 65*a*, 65*b* and 65*c* through the first metal contact plugs 71*a*, 71*b* and 71*c*, respectively. In addition, a first metal guard ring 73*g* may be provided on the first metal guard ring plug 71*g*.

An inter-metal insulating layer 75 is provided on first lower metal interconnects 73*a*, 73*b* and 73*c*. The inter-metal insulating layer 75 may be, for example, a spin-on-glass (SOG) layer, which may have strong moisture absorbance characteristics. The first metal guard ring 73*g* is exposed by a second metal guard ring contact hole 77*g* that penetrates the inter-metal insulating layer 75. A second metal guard ring plug 79*g* is provided in the second metal guard ring contact hole 77*g*. A second metal guard ring 81*g* is provided on the second metal guard ring plug 79*g*. The intermediate interconnect guard ring 65*g*, the first metal guard ring plug 71*g*, the first metal guard ring 73*g*, the second metal guard ring plug 79*g* and the second metal guard ring 81*g* make up a fuse guard ring G.

First and second passivation layers 83 and 85, which are sequentially stacked, are provided on the second metal guard ring 81*g*. A fuse window 87 is provided in the first and second passivation layers 83 and 85, the inter-metal insulating layer 75, and the upper interlayer insulating layer 67. The fuse window 87 is provided on the first and second fuses 65*f'* and 65*f"*. As a result, an interlayer insulating layer 67*t*, which is thinner than the initial upper interlayer insulating layer 67, is provided on the first and second fuses 65*f'* and 65*f"*. The fuse window 87 may be used to perform a laser repair process for blowing the first and second fuses 65*f'* and 65*f"*.

As discussed above, some embodiments of the present invention provide adjacent first and second fuses 65*f'* and 65*f"* that are electrically coupled to each other through the second and fourth lower interconnects 55*b* and 55*d*, formed of a non-corrosive material layer. Thus, even though one of the first and second fuses 65*f'* and 65*f"* is blown using the laser repair process, another fuse adjacent to the blown fuse may not be corroded because of the presence of the lower interconnects 55*a*, 55*b*, 55*c* and 55*d*. Accordingly, the likelihood that other fuses adjacent to the blown fuse will be corroded may be reduced. In addition, the fuse guard ring G surrounds the first and second fuses 65*f'* and 65*f"*. Accordingly, even though the interlayer insulating layers 57 and 67 and the inter-metal insulating layer 75 may be, for example, BPSG layers or SOG layers, the fuse guard ring G may block moisture that may be introduced into the interlayer insulating layers 57 and 67 and the metal interlayer insulating layer 75 through the fuse window 87. Thus, the fuse guard ring G may reduce the likelihood that internal circuits adjacent to the first and second fuses 65*f'* and 65*f"* will be damaged.

Figure 3:
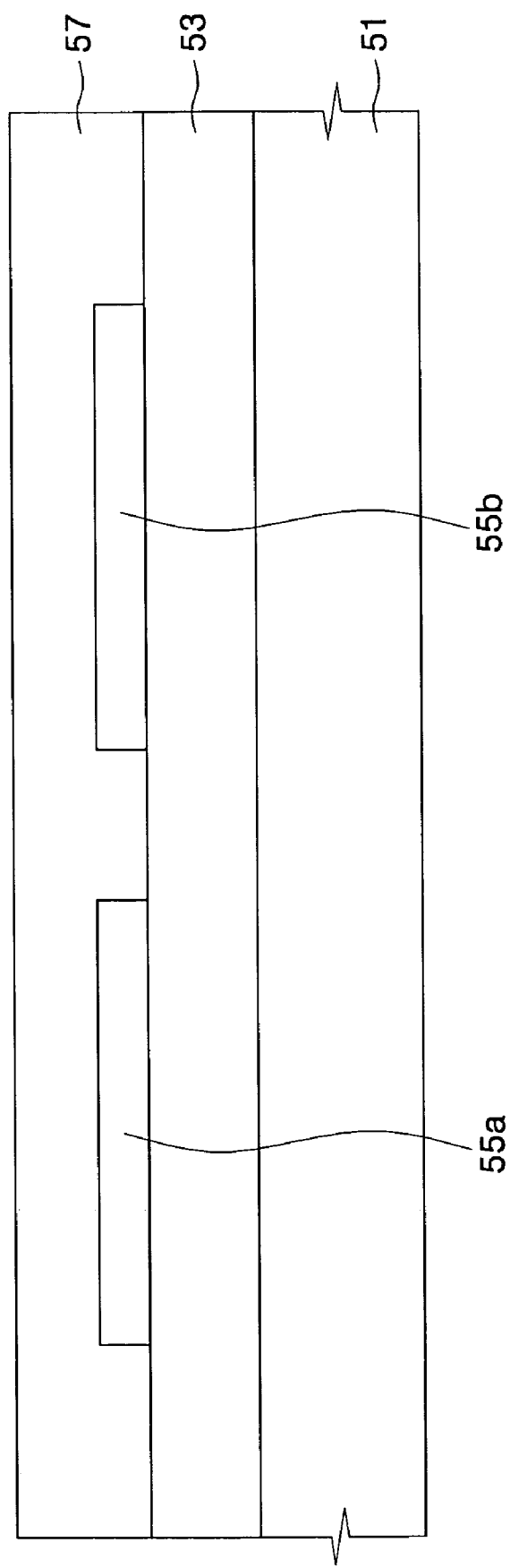
FIGS. 3 to 6 are cross-sections taken along the line II–II' of FIG. 2 illustrating processing steps in the fabrication of fuse regions according to some embodiments of the present invention.

Referring now to FIGS. 3 through 6, processing steps in the fabrication of integrated circuit devices having fuse regions according to some embodiments of the present invention will be discussed. Referring now to FIGS. 2 and 3, an insulating layer 53, such as a device isolation layer, is formed on an integrated circuit substrate 51. A conductive layer is formed on the insulating layer 53. The conductive layer may be, for example, a gate electrode layer of a MOS transistor. In these embodiments of the present invention, the conductive layer may include a non-corrosive material layer such as a polysilicon layer and/or a polycide layer. The conductive layer is patterned to form first, second, third and fourth lower interconnects 55*a*, 55*b*, 55*c* and 55*d*, which are spaced apart, on the insulating layer 53. The first and second lower interconnects 55*a* and 55*b* are formed in a first straight line, and the third and fourth lower interconnects 55*c* and 55*d* are formed in a second straight line that is parallel to the first straight line. The third lower interconnect 55*c* is formed to be adjacent to the first lower interconnect 55*a*, and the fourth lower interconnect 55*d* is formed to be adjacent to the second lower interconnect 55*b*. A lower interlayer insulating layer 57 is formed on the lower interconnects 55*a*, 55*b*, 55*c* and 55*d*. The lower interlayer insulating layer 57 may include, for example, a BPSG layer having strong moisture absorbance characteristics.

Figure 4:
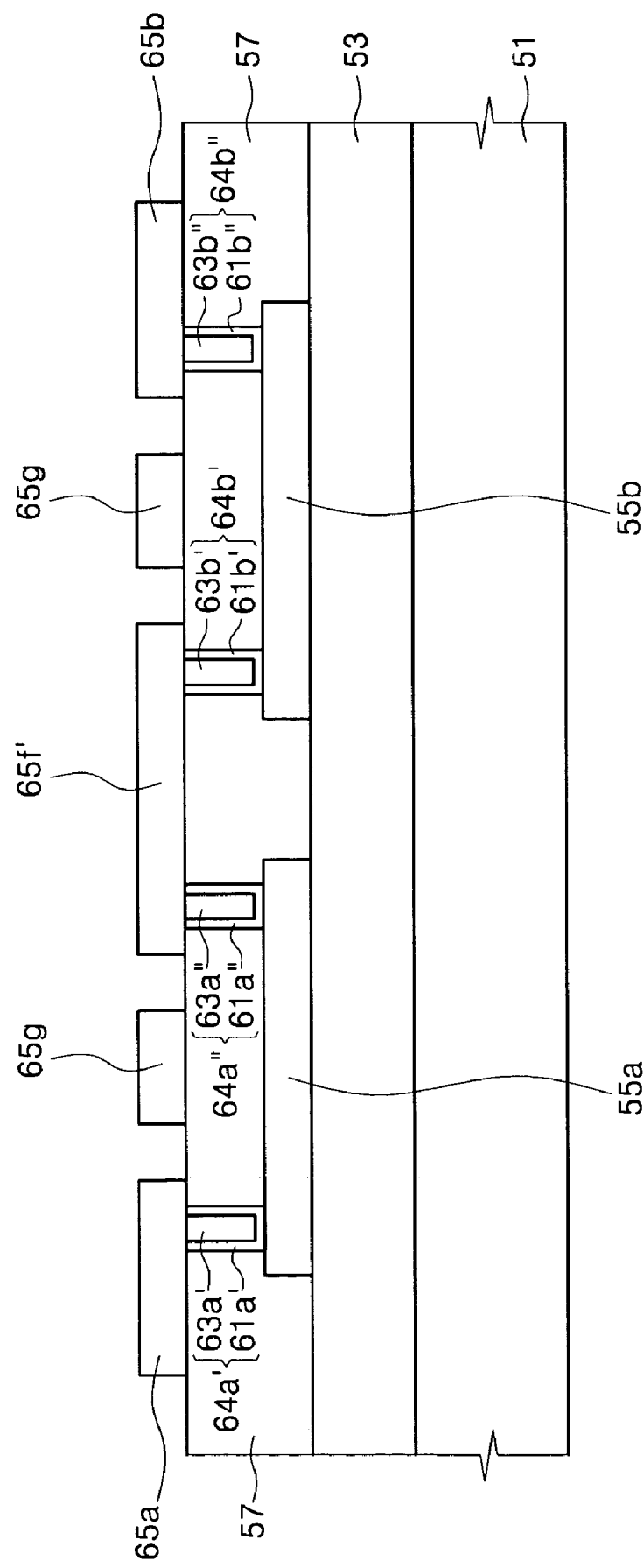

Referring now to FIGS. 2 and 4, the lower interlayer insulating layer 57 is patterned to form fuse contact holes (59*a'*, 59*a"*, 59*b'*, 59*b"*, 59*c'*, 59*c"*, 59*d'* and 59*d"* of FIG. 2) that expose ends of the lower interconnects 55*a*, 55*b*, 55*c* and 55*d*. An intermediate interconnect layer is formed on the fuse contact holes 59*a'*, 59*a"*, 59*b'*, 59*b"*, 59*c'*, 59*c"*, 59*d'* and 59*d"*. In an integrated circuit memory device such as a dynamic random access memory (DRAM), the intermediate interconnect layer may correspond to a conductive layer to form a bit line. In these embodiments of the present invention, the intermediate interconnect layer may include a tungsten layer in order to possibly reduce electrical resistance of the bit line. It will be understood that the tungsten may be a corrosive material layer and, therefore, may be vulnerable to moisture.

In some embodiments of the present invention, the fuse contact plugs (64*a'*, 64*a"*, 64*b'* and 64*b"* of FIG. 4) may be formed in the fuse contact holes 59*a'*, 59*a"*, 59*b'*, 59*b"*, 59*c'*, 59*c"*, 59*d'* and 59*d"* prior to formation of the intermediate interconnect layer. In these embodiments of the present invention, the fuse contact plugs 64*a'*, 64*a"*, 64*b'* and 64*b"* may include barrier metal layers 61*a'*, 61*a"*, 61*b'* and 61*b"* and metal plug layers 63*a'*, 63*a"*, 63*b'* and 63*b"*. The barrier metal layers 61*a'*, 61*a"*, 61*b'* and 61*b"* may include, for example, a titanium nitride layer that corresponds to a non-corrosive material layers. The metal plug layers 63*a'*, 63*a"*, 63*b'* and 63*b"* may include, for example, a tungsten layer.

The intermediate interconnect layer is patterned to form first and second fuses 65*f'* and 65*f"* and first, second and third intermediate interconnects 65*a*, 65*b* and 65*c* on the fuse contact holes 59*a'*, 59*a"*, 59*b'*, 59*b"*, 59*c'*, 59*c"*, 59*d'* and 59*d"*. The first fuse 65*f'* is formed in the region between the first and second lower interconnects 55*a* and 55*b*, and the second fuse 65*f"* is formed in the region between the third and fourth lower interconnects 55*c* and 55*d*. The first fuse 65*f'* is electrically coupled to the first and second lower interconnects 55*a* and 55*b* through the fuse contact holes 59*a"* and 59*b'*, respectively, and the second fuse 65*f"* is electrically connected to the third and fourth lower interconnects 55*c* and 55*d* through the fuse contact holes 59*c"* and 59*d'*, respectively. Furthermore, the first intermediate interconnect 65*a* is electrically coupled to the first lower interconnect 55*a* through the fuse contact hole 59*a'* and is located opposite the first fuse 65*f'*. The second intermediate interconnect 65*b* is electrically coupled to the second and fourth lower interconnects 55b and 55d through the fuse contact holes 59b'' and 59d'', respectively, and is located opposite the first and second fuses 65f' and 65f''. Furthermore, the third intermediate interconnect 65c is electrically coupled to the third lower interconnect 55c through the fuse contact hole 59c' and is located opposite the second fuse 65f''.

In some embodiments of the present invention, an intermediate interconnect guard ring 65g surrounding the first and second fuses 65f' and 65f'' may be simultaneously formed with the first and second fuses 65f' and 65f'' and the intermediate interconnects 65a, 65b and 65c. The intermediate interconnect guard ring 65g is formed to pass through the region between the first and second fuses 65f' and 65f'' and the intermediate interconnects 65a, 65b and 65c, as illustrated in FIG. 2.

Figure 5:
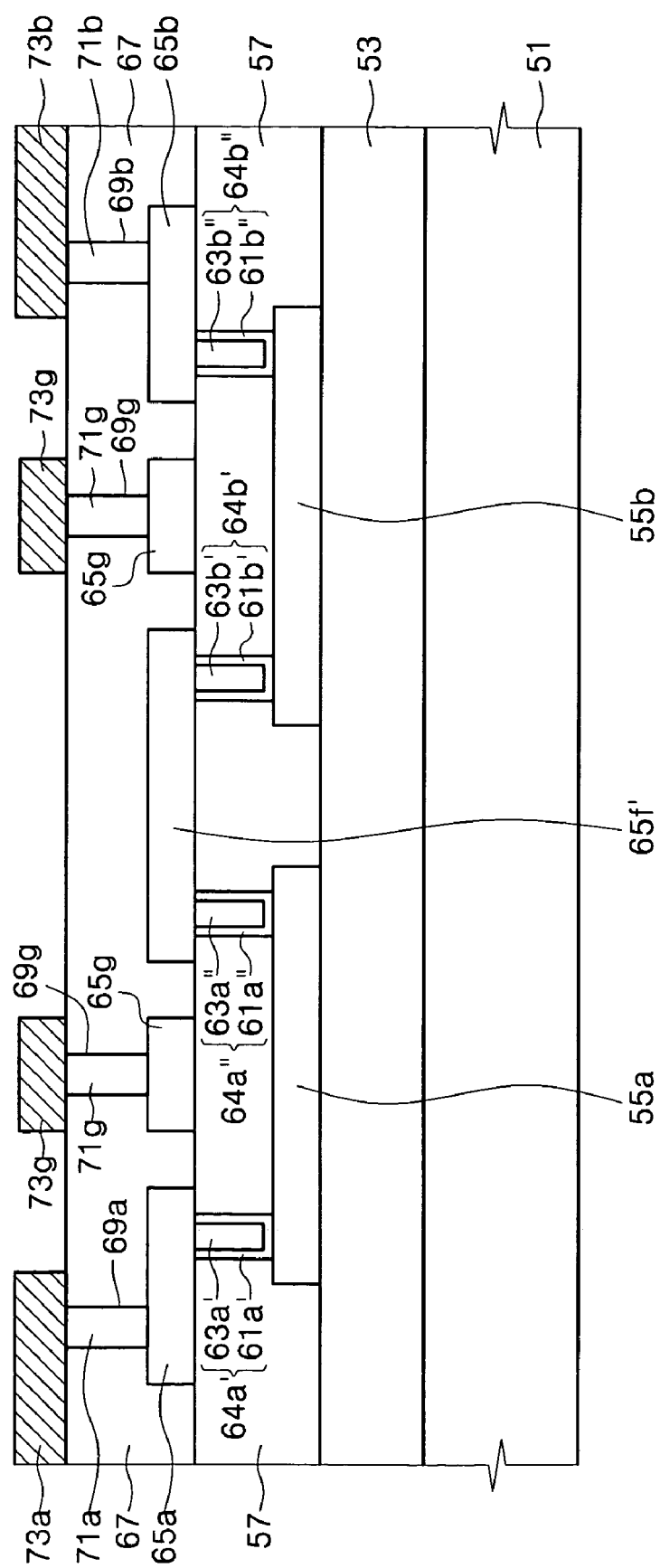

Referring now to FIGS. 2 and 5, an upper interlayer insulating layer 67 is formed on the integrated circuit substrate including the first and second fuses 65f' and 65f''. The upper interlayer insulating layer 67 may also be formed of a BPSG layer. The upper interlayer insulating layer 67 is patterned to form first metal contact holes 69a, 69b and 69c that expose the first to third intermediate interconnects 65a, 65b and 65c. The first metal contact hole 69a exposes the first intermediate interconnect 65a, and the third metal contact hole 69c exposes the third intermediate interconnect 65c. Similarly, the second metal contact hole 69b exposes the second intermediate interconnect 65b. In embodiments of the present invention including the intermediate interconnect guard ring 65g, a first metal guard ring contact hole 69g exposing the intermediate interconnect guard ring 65g may be formed.

A first metal layer is formed on the first metal contact holes 69a, 69b and 69c and the first metal guard ring contact hole 69g. The first metal layer may include, for example, an aluminum layer, a tungsten layer and/or a copper layer. First metal contact plugs 71a, 71b and 71c and a first metal guard ring plug 71g may be formed in the first metal contact holes 69a, 69b and 69c and the first metal guard ring contact hole 69g, respectively, prior to formation of the first metal layer. The first metal contact plugs 71a, 71b and 71c and the first metal guard ring plug 71g may include a metal layer, such as a tungsten layer.

The first metal layer is patterned to form first, second and third lower metal interconnects 73a, 73b and 73c that cover the first metal contact plugs 71a, 71b and 71c, respectively. Furthermore, a first metal guard ring 73g may be formed to cover the first metal guard ring plug 71g. In embodiments of the present invention wherein the first metal layer includes a copper layer, the copper layer may be patterned using a damascene technology.

Referring now to FIGS. 2 and 6, an inter-metal insulating layer 75 is formed on the integrated circuit substrate including the first to third lower metal interconnects 73a, 73b and 73c and the first metal guard ring 73g. The inter-metal insulating layer 75 may include a SOG layer. The SOG layer may have strong moisture absorbance characteristics like the BPSG layer. SOG layers may be used due to their flatness properties at temperatures lower than about 200° C. The metal interlayer insulating layer 75 is patterned to form a second metal guard ring contact hole 77g that exposes the first metal guard ring 73g. A second metal guard ring plug 79g may be formed in the second metal guard ring contact hole 77g. The second metal guard ring plug 79g may be formed of the same material layer as the first metal guard ring plug 71g.

A second metal layer is formed on the integrated circuit substrate including the second metal guard ring plug 79g. The second metal layer may be formed of, for example, an aluminum layer, a tungsten layer and/or a copper layer. The second metal layer is patterned to form a second metal guard ring 81g that covers the second metal guard ring plug 79g. The intermediate interconnect guard ring 65g, the first metal guard ring plug 71g, the first metal guard ring 73g, the second metal guard ring plug 79g and the second metal guard ring 81g make up a fuse guard ring G.

First and second passivation layers 83 and 85 are sequentially formed on the integrated circuit substrate having the second metal guard ring 81g. The first and second passivation layers 83 and 85 may include, for example, a plasma oxide layer and a plasma nitride layer, respectively. The second passivation layer 85, for example, the plasma nitride layer, may reduce the likelihood that external moisture will penetrate the integrated circuits formed on the integrated circuit substrate 51. Furthermore, the first passivation layer 83, for example, the plasma oxide layer, may act as a buffer layer that may alleviate the stress of the plasma nitride layer.

The first and second passivation layers 83 and 85, the inter-metal insulating layer 75, and the upper interlayer insulating layer 67 are etched to form a fuse window 87 on the first and second fuses 65f' and 65f''. The fuse window 87 may be etched close to the first and second fuses 65f' and 65f'', but the etch should be stopped prior to exposure of the first and second fuses 65f' and 65f''. Accordingly, an interlayer insulating layer 67t, which is thinner than the initial upper interlayer insulating layer 67, is provided on the first and second fuses 65f' and 65f''. The fuse window 87 exposes at least a portion of the upper interlayer insulating layer 67 and the inter-metal insulating layer 75, as illustrated in FIG. 6. In embodiments of the present invention where the upper interlayer insulating layer 67 and the inter-metal insulating layer 75 include a BPSG layer and/or a SOG layer having strong moisture absorbance characteristics as described above, external moisture in the atmosphere can be introduced into the upper interlayer insulating layer 67 and the inter-metal insulating layer 75. However, the fuse guard ring G may decrease the likelihood that the external moisture will reach internal circuits (not shown) adjacent to the fuses 65f' and 65f''. The external moisture may be introduced through the portion between the first and second fuses 65f' and 65f'' and the intermediate interconnect guard ring 65g as indicated by the arrows "A". Accordingly, the amount of the moisture introduced into the internal circuits may be reduced according to some embodiments of the present invention.

Figure 7:
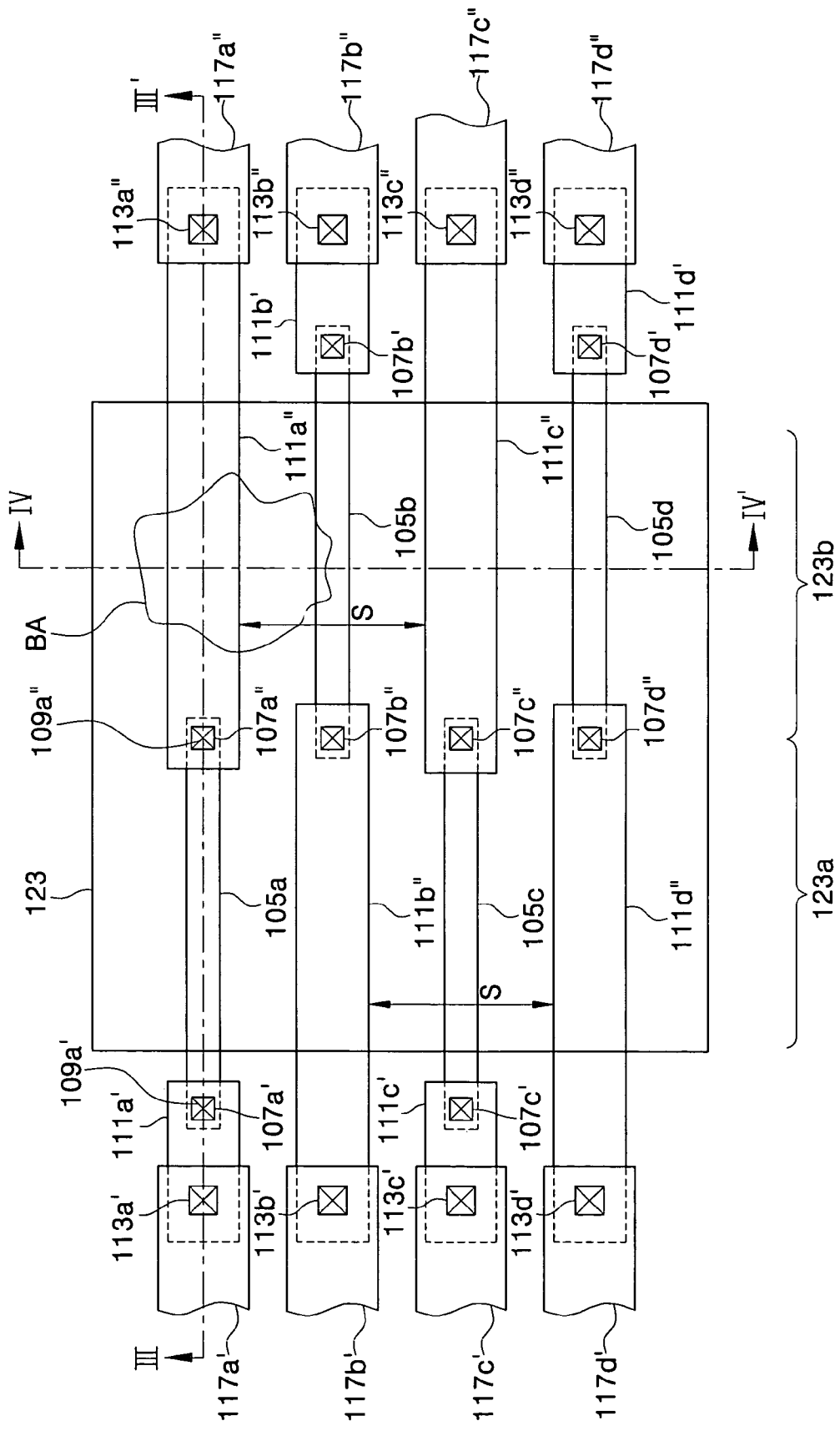
FIG. 7 is a top plan view illustrating fuse regions according to further embodiments of the present invention.
Figure 8:
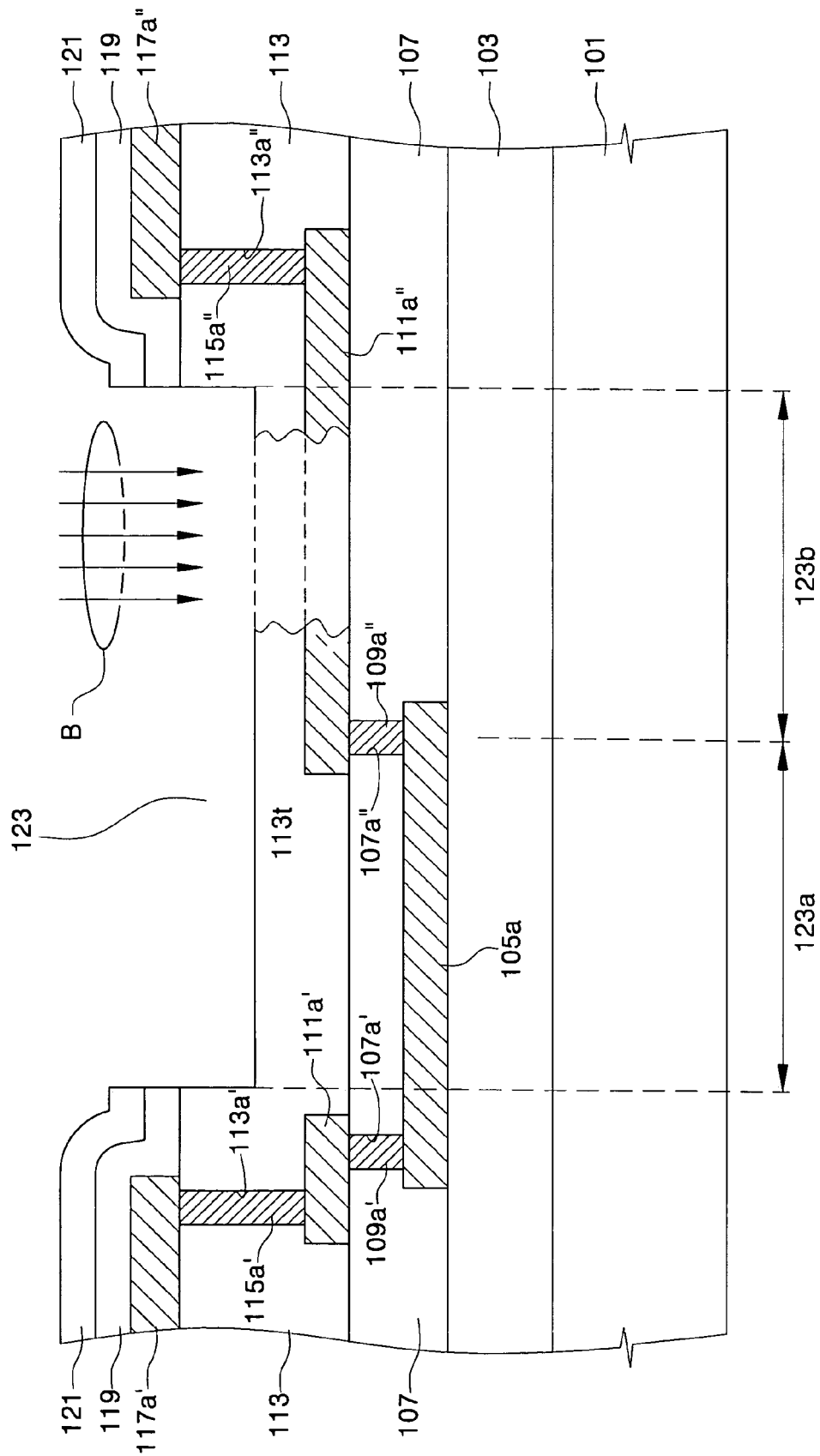
FIG. 8 is a cross section taken along the line III–III' of FIG. 7 illustrating fuse regions according to some embodiments of the present invention.
Figure 9:
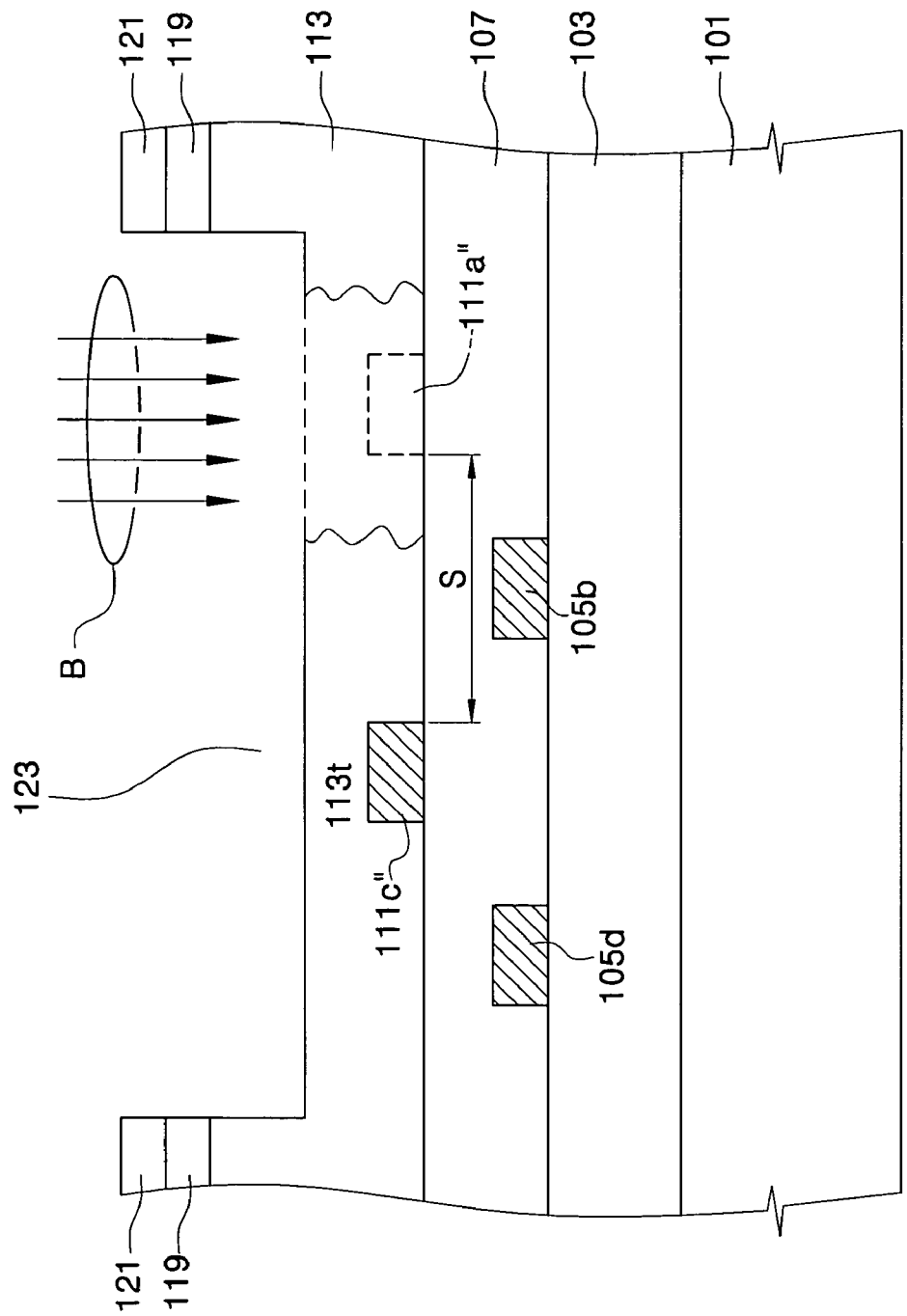
FIG. 9 is a cross section taken along the line IV–IV' of FIG. 7 illustrating fuse regions according to further embodiments of the present invention.

FIG. 7 is a top plan view illustrating fuse regions according to further embodiments of the present invention. FIG. 8 is a cross section taken along the line III–III' of FIG. 7 and FIG. 9 is a cross section taken along the line IV–IV' of FIG. 7. Referring now to FIGS. 7, 8 and 9, a lower interlayer insulating layer 103 is stacked on an integrated circuit substrate 101. A portion of the integrated circuit substrate 101 is divided into a first region 123a and a second region 123b, which are adjacent to each other. A plurality of parallel lower interconnects are disposed on the lower interlayer insulating layer 103. For example, the lower interconnects may include first, second, third and fourth lower interconnects 105a, 105b, 105c and 105d as illustrated in FIG. 7. In these embodiments of the present invention, the first and third lower interconnects 105a and 105c, i.e., odd-numbered lower interconnects, are disposed in the first region 123a, the second and fourth lower interconnects 105b and 105d, i.e., even-numbered lower interconnects, are disposed in the second region 123b.

The lower interconnects 105a, 105b, 105c and 105d may be conductive patterns, which may be formed simultaneously with gate electrodes of MOS transistors in an integrated circuit device. In other words, the lower interconnects 105a, 105b, 105c and 105d may be the same material layer as the gate electrodes. For example, the lower interconnects 105a, 105b, 105c and 105d may be non-corrosive material layer patterns such as polysilicon patterns and/or tungsten polycide patterns.

An intermediate interlayer insulating layer 107 is provided on the lower interconnects 105a, 105b, 105c and 105d and the lower interlayer insulating layer 103. Ends of the lower interconnects 105a, 105b, 105c and 105d are exposed by first through eighth fuse contact holes 107a', 107a", 107b', 107b", 107c', 107c", 107d' and 107d" that penetrate the intermediate interlayer insulating layer 107. In particular, the first and second fuse contact holes 107a' and 107a" expose ends of the first lower interconnect 105a, and the third and fourth fuse contact holes 107b' and 107b" expose ends of the second lower interconnect 105b. Similarly, the fifth and sixth fuse contact holes 107c' and 107c" expose ends of the third lower interconnect 105c, and the seventh and eighth fuse contact holes 107d' and 107d" expose ends of the fourth lower interconnect 105d.

First and second fuse contact plugs 109a' and 109a" may be formed in first and second fuse contact holes 107a' and 107a", respectively. Similarly, third to eighth fuse contact plugs (not shown) may be provided in the third to eighth fuse contact holes 107b', 107b", 107c', 107c", 107d' and 107d", respectively. The fuse contact plugs may include, for example, a barrier metal layer and a metal plug layer on the barrier metal layer. In these embodiments of the present invention, the barrier metal layer may be a non-corrosive material layer such as a titanium nitride layer, and the metal plug layer may be a tungsten layer. In some embodiments of the present invention, the fuse contact plugs may include a polysilicon layer.

A plurality of fuses, for example, first through fourth parallel fuses 111a", 111b", 111c" and 111d", are disposed on the intermediate interlayer insulating layer 107. In these embodiments of the present invention, the second and fourth fuses 111b" and 111d", i.e., even-numbered fuses, are located in the first region 123a, and the first and third fuses 111a" and 111c", i.e., odd-numbered fuses, are located in the second region 123b. Furthermore, the first to fourth fuses 111a", 11b", 111c" and 111d" are disposed in extension lines of the first to fourth lower interconnects 105a, 105b, 105c and 105d, respectively. Accordingly, a pitch size of the even-numbered fuses (or the odd-numbered fuses) in the first region 123a (or the second region 123b) may be increased by about twice that of conventional devices. In other words, it may be possible to increase spaces 5 between the fuses relative to conventional devices. The fuses 111a", 111b", 111c" and 111d" may include a metal layer, for example, a tungsten layer.

The second and fourth fuses 111b" and 111d" are electrically coupled to the second and fourth lower interconnects 105b and 105d through the fourth and eighth fuse contact plugs, respectively and the first and third fuses 111a" and 111c" are electrically coupled to the first and third lower interconnects 105a and 105c through the second and sixth fuse contact plugs, respectively.

Furthermore, first and third intermediate interconnects 111a' and 111c' may be provided on the intermediate interlayer insulating layer 107. The first and third intermediate interconnects 111a' and 111c' are adjacent to the first region 123a and are located opposite the second region 123b. In addition, second and fourth intermediate interconnects 111b' and 111d' may also be provided on the intermediate interlayer insulating layer 107. The second and fourth intermediate interconnects 111b' and 111d' are adjacent to the second region 123b and are located opposite the first region 123a. In some embodiments of the present invention, the intermediate interconnects 111a', 111b', 111c' and 111d' may be the same material layer as the fuses. In these embodiments of the present invention, the first and third intermediate interconnects 111a' and 111c' are electrically coupled to the first and third lower interconnects 105a and 105c through the first and fifth fuse contact plugs, respectively, and the second and fourth intermediate interconnects 111b' and 111d' are electrically coupled to the second and fourth lower interconnects 105b and 105d through the third and seventh fuse contact plugs, respectively.

An upper interlayer insulating layer 113 is provided on the intermediate interconnects 111a', 111b', 111c' and 111d', the fuses 111a", 111b", 111c" and 111d", and the intermediate interlayer insulating layer 107. The first intermediate interconnect 111a', the second fuse 111b", the third intermediate interconnect 111c' and the fourth fuse 111d" are exposed by first through fourth upper interconnect contact holes 113a', 113b', 113c' and 113d', respectively, that penetrate the upper interlayer insulating layer 113. The first through fourth upper interconnect contact holes 113a', 113b', 113c' and 113d' are adjacent the first region 123a and are located opposite the second region 123b. Similarly, the first fuse 111a", the second intermediate interconnect 111b', the third fuse 111c" and the fourth intermediate interconnect 111d' are exposed by fifth through eighth upper interconnect contact holes 113a", 113b", 113c" and 113d", respectively, that penetrate the upper interlayer insulating layer 113. The fifth through eighth upper interconnect contact holes 113a", 113b", 113c" and 113d" are adjacent the second region 123b and are located opposite the first region 123a.

Furthermore, the first to fourth lower interconnects 105a, 105b, 105c and 105d may be exposed by the first, third, sixth and eighth upper interconnect contact holes 113a', 113c', 113b" and 113d", respectively, without presence of the first to fourth intermediate interconnects 111a', 111b', 111c' and 111d'.

First and fifth upper interconnect contact plugs 115a' and 115a" may be formed in the first through fifth upper interconnect contact holes 113a' and 113a", respectively. Similarly, second to fourth upper interconnect contact plugs (not shown) may be formed in the second to fourth upper interconnect contact holes 113b', 113c' and 113d', respectively, and sixth to eighth upper interconnect contact plugs (not shown) may be formed in the sixth to eighth upper interconnect contact holes 113b", 113c" and 113d", respectively.

First to eighth upper interconnects 117a', 117b', 117c', 117d', 117a", 117b", 117c" and 117d" are provided on the upper interlayer insulating layer 113. The first and fifth upper interconnects 117a' and 117a" are electrically coupled to the first and fifth upper interconnect contact plugs 115a' and 115a", respectively. Similarly, the second to fourth upper interconnects 117b', 117c' and 117d' are electrically coupled to the second to fourth upper interconnect contact plugs, respectively, and the sixth to eighth upper interconnects 117b", 117c" and 117d" are electrically coupled to the sixth to eighth upper interconnect contact plugs, respectively. The first to fourth upper interconnects 117a', 117b', 117c' and 117d' are adjacent to the first region 123a and are located opposite the second region 123b, and the fifth to eighth upper interconnects 117a", 117b", 117c" and 117d"

are adjacent to the second region 123*b* and are located opposite the first region 123*a*.

A passivation layer is provided on the substrate having the upper interconnects 117*a*', 117*b*', 117*c*', 117*d*', 117*a*", 117*b*", 117*c*" and 117*d*". The passivation layer may include first and second passivation layers 119 and 121. In this case, the first and second passivation layers 119 and 121 may be a silicon oxide layer and a silicon nitride layer, respectively.

A fuse window 123 may be located in the passivation layer and the upper interlayer insulating layer 113. The fuse window 123 is provided in the area including the first and second regions 123*a* and 123*b*. Thus, a recessed upper interlayer insulating layer 113*t* that is thinner than the initial upper interlayer insulating layer 113 may be formed on the fuses 111*a*", 111*b*", 111*c*" and 111*d*". The fuse window 123 may be provided so that at least one of the fuses 111*a*", 111*b*", 111*c*" and 111*d*" may be blown using, for example, a laser beam.

According to some embodiments described above, a failure rate due to a repair process may be significantly reduced. In particular, a laser beam (B) may be irradiated onto a 30 predetermined region (BA) over a selected fuse, for example, the first fuse 111*a*", in order to blow the first fuse 111*a*". In this case, even though the laser beam B is misaligned with the first fuse 111*a*" or a diameter of the laser beam B is increased, non-selected fuses, for example, the third fuse 111*c*", adjacent to the first fuse 111*a*" may not be damaged or exposed as illustrated in FIGS. 7 through 9. Accordingly, a laser repair yield may be greatly increased according to embodiments of the present invention, since the non-selected fuses may not be corroded by moisture in the atmosphere.

Figure 10:
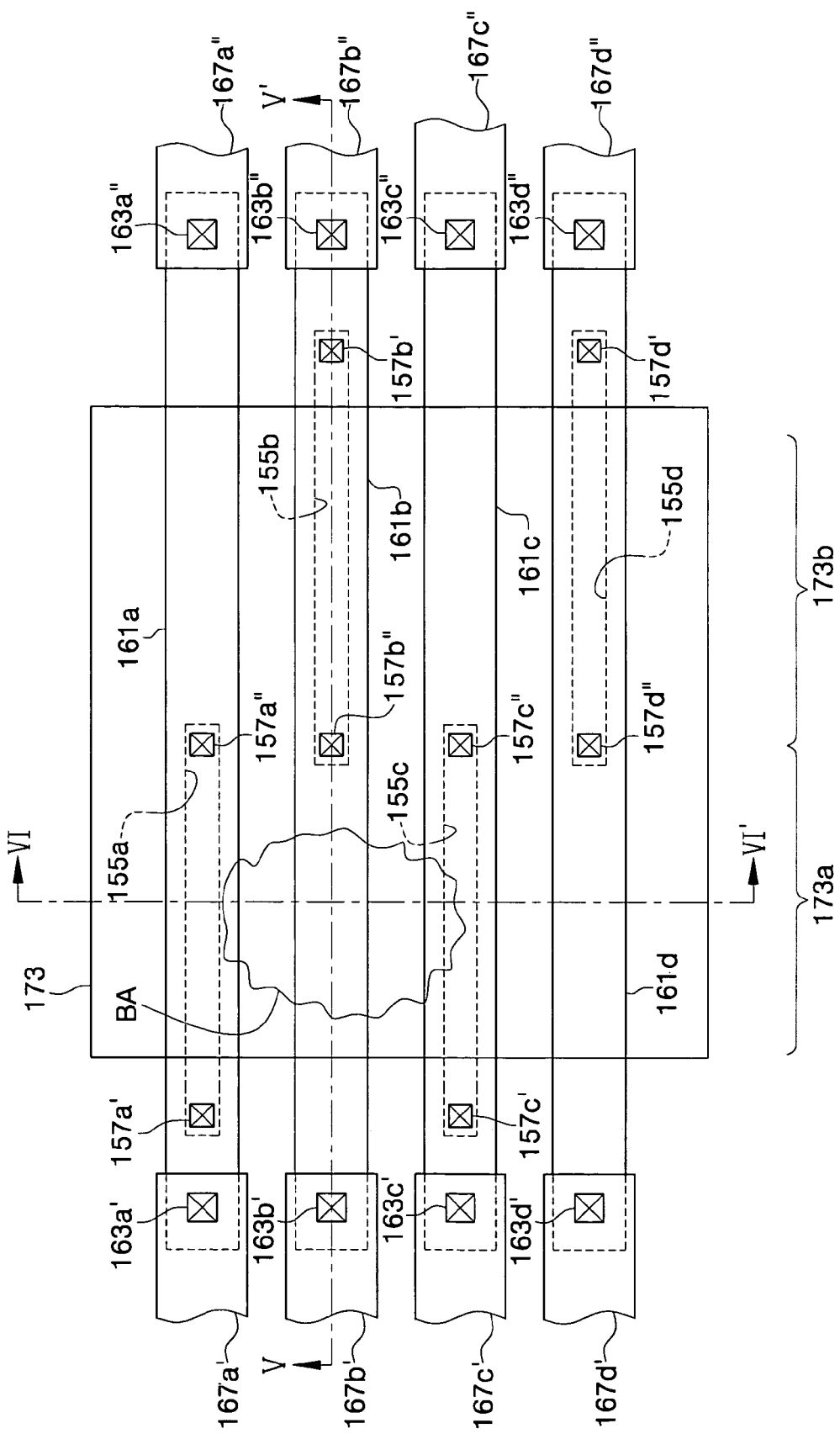
FIG. 10 is a top plan view illustrating fuse regions according to still further embodiments of the present invention.

FIG. 10 is a top plan view illustrating fuse regions according to further embodiments of the present invention. FIG. 11 is a cross section taken along the line V–V' of FIG. 10 and FIG. 12 is a cross section taken along the line VI–VI' of FIG. 10. Referring now to FIGS. 10, 11 and 12, a lower interlayer insulating layer 153 is stacked on an integrated circuit substrate 151. A portion of the integrated circuit substrate 151 is divided into a first region 173*a* and a second region 173*b*. A plurality of parallel lower interconnects are provided on the lower interlayer insulating layer 153. For example, the lower interconnects may include first to fourth lower interconnects 155*a*, 155*b*, 155*c* and 155*d* as illustrated in FIG. 10. In these embodiments of the present invention, the first and third lower interconnects 155*a* and 155*c*, i.e., odd-numbered lower interconnects, are located in the first region 173*a*, and the second and fourth lower interconnects 155*b* and 155*d*, i.e., even-numbered lower interconnects are located in the second region 173*b*.

The lower interconnects 155*a*, 155*b*, 155*c* and 155*d* may be conductive layer patterns, which may be simultaneously formed with gate electrodes of MOS transistors in an integrated circuit device. In other words, the lower interconnects 155*a*, 155*b*, 155*c* and 155*d* may be the same material layer as the gate electrodes. For example, the lower interconnects 155*a*, 155*b*, 155*c* and 155*d* may be non-corrosive material patterns such as polysilicon patterns and/or tungsten polycide patterns.

An intermediate interlayer insulating layer 157 is formed on the lower interconnects 155*a*, 155*b*, 155*c* and 155*d* and the lower interlayer insulating layer 153. Ends of the lower interconnects 155*a*, 155*b*, 155*c* and 155*d* are exposed by first to eighth fuse contact holes 157*a*', 157*a*", 157*b*', 157*b*", 157*c*', 157*c*", 157*d*' and 157*d*" that penetrate the intermediate interlayer insulating layer 157. In particular, the first and second fuse contact holes 157*a*' and 157*a*" expose ends of the first lower interconnect 155*a*, respectively, and the third and fourth fuse contact holes 157*b*' and 157*b*" expose ends of the second lower interconnect 155*b*, respectively. Similarly, the fifth and sixth fuse contact holes 157*c*' and 157*c*" expose ends of the third lower interconnect 155*c*, respectively, and the seventh and eighth fuse contact holes 157*d*' and 157*d*" expose ends of the fourth lower interconnect 155*d*, respectively.

First and second fuse contact plugs (not shown) may be provided in the first and second fuse contact holes 157*a*' and 157*a*", respectively, and third and fourth fuse contact plugs 157*c*' and 157*c*" may be provided in the third and fourth fuse contact holes 157*b*' and 157*b*", respectively. Similarly, fifth and sixth fuse contact plugs 157*c*' and 157*c*" may be provided in the fifth and sixth fuse contact holes 157*c*' and 157*c*", respectively, and seventh and eighth fuse contact plugs 157*c*' and 157*c*" may be provided in the seventh and eighth fuse contact holes 157*d*' and 157*d*", respectively. The fuse contact plugs may include, for example, a barrier metal layer and a metal plug layer on the barrier layer. In this case, the barrier metal layer may be a non-corrosive material layer such as a titanium nitride layer, and the metal plug layer may be a tungsten layer. In some embodiments of the present invention, the fuse contact plugs may be, for example, polysilicon plugs.

A plurality of fuses, for example, first to fourth parallel fuses 161*a*, 161*b*, 161*c* and 161*d*, are provided on the intermediate interlayer insulating layer 157. The fuses 161*a*, 161*b*, 161*c* and 161*d* may include metal patterns, for example, tungsten patterns. The first to fourth fuses 161*a*, 161*b*, 161*c* and 161*d* are provided on the first and second regions 173*a* and 173*b* and overlap with the first to fourth lower interconnects 155*a*, 155*b*, 155*c* and 155*d*, respectively. Thus, the first to fourth fuses 161*a*, 161*b*, 161*c* and 161*d* may have first to fourth overlap portions that overlap with the first to fourth lower interconnects 155*a*, 155*b*, 155*c* and 155*d*. The first and third overlap portions are located in the first region 173*a*, and the second and fourth overlap portions are located in the second region 173*b*. Ends of the first overlap portion are electrically coupled to ends of the first lower interconnect 155*a* through the first and second fuse contact plugs, respectively, and ends of the second overlap portion are electrically coupled to ends of the second lower interconnect 155*b* through the third and fourth fuse contact plugs 159*b*' and 159*b*", respectively. Similarly, ends of the third overlap portion are electrically coupled to ends of the third lower interconnect 155*c* through the fifth and sixth fuse contact plugs, respectively, and ends of the fourth overlap portion are electrically coupled to ends of the fourth lower interconnect 155*d* through the seventh and eighth fuse contact plugs, respectively.

An upper interlayer insulating layer 163 is formed on the fuses 161*a*, 161*b*, 161*c* and 161*d* and the intermediate interlayer insulating layer 157. Ends of the fuses 161*a*, 161*b*, 161*c* and 161*d* are exposed by first to eighth upper interconnect contact holes 163*a*', 163*b*', 163*c*', 163*d*', 163*a*", 163*b*", 163*c*" and 163*d*". In particular, the first and fifth upper interconnect contact holes 163*a*' and 163*a*" expose the ends of the first fuse 161*a*, and the second and sixth upper interconnect contact holes 163*b*' and 163*b*" expose the ends of the second fuse 161*b*. The third and seventh upper interconnect contact holes 163*c*' and 163*c*" expose the ends of the third fuse 161*c*, and the fourth and eighth upper interconnect contact holes 163*d*' and 163*d*" expose the ends of the fourth fuse 161*d*.

First and fifth upper interconnect contact plugs (not shown) may be formed in the first and fifth upper interconnect contact holes 163a' and 163a", respectively, and second and sixth upper interconnect contact plugs (not shown) may be formed in the second and sixth upper interconnect contact holes 163b' and 163b", respectively. Similarly, third and seventh upper interconnect contact plugs (not shown) may be formed in the third and seventh upper interconnect contact holes 163c' and 163c", respectively, and fourth and eighth upper interconnect contact plugs (not shown) may be provided in the fourth and eighth upper interconnect contact holes 163d' and 163d", respectively.

First to eighth upper interconnects 167a' and 167b', 167c', 167d', 167a", 167b", 167c" and 167d" are formed on the upper interlayer insulating layer 163. The first and fifth upper interconnects 167a' and 167a" are electrically coupled to the first and fifth upper interconnect contact plugs, respectively, and the second and sixth upper interconnects 167b' and 167b" are electrically coupled to the second and sixth upper interconnect contact plugs 165b' and 165b", respectively. The third and seventh upper interconnects 167c' and 167c" are electrically coupled to the third and seventh upper interconnect contact plugs, respectively, and the fourth and eighth upper interconnects 167d' and 167d" are electrically coupled to the fourth and eighth upper interconnect contact plugs, respectively.

The first to fourth upper interconnects 167a', 167b', 167c' and 167d' are adjacent to the first region 173a and are located opposite the second region 173b, and the fifth to eighth upper interconnects 167a", 167b", 167c" and 167d" are adjacent to the second region 173b and are located opposite the first region 173a.

A passivation layer is provided on a surface of the integrated circuit substrate including the upper interconnects 167a', 167b', 167c', 167d', 167a", 167b", 167c" and 167d". The passivation layer may include first and second passivation layers 169 and 171, which are sequentially stacked. In these embodiments of the present invention, the first and second passivation layers 169 and 171 may include, for example, a silicon oxide layer and a silicon nitride layer, respectively.

A fuse window 173 may be provided in the passivation layer and the upper interlayer insulating layer. The fuse window 173 is located in the area including the first and second regions 173a and 173b. A recessed upper interlayer insulating layer 163t, which is thinner than the initial upper interlayer insulating layer 163, may be formed on the fuses 161a, 161b, 161c and 161d. The fuse window 173 may be provided so that at least one of the fuses 161a, 161b, 161c and 161d may be successfully blown using, for example, a laser beam.

As discussed above with respect to FIGS. 10 to 12, the even-numbered fuses 161b and 161d may be blown by a laser beam that is irradiated onto the first region 173a of the integrated circuit substrate, and the odd-numbered fuses 161a and 161c may be blown by a laser beam that is irradiated onto the second region 173b of the integrated circuit substrate. For example, in order to selectively blow the second fuse 161b, a laser beam B may be irradiated onto a predetermined area BA over the second fuse 161b that is located in the first region 173a of the integrated circuit substrate. In these embodiments of the present invention, if the laser beam B is misaligned with the second fuse 161b or a diameter of the laser beam B is increased, non-selected fuses, for example, the first and/or the third fuses 161a and/or 161c, adjacent to the selected fuse 161b may be damaged or cut as illustrated in FIG. 12. Nevertheless, the first lower. interconnect 155a may provide a normal current path between the first and fifth upper interconnects 167a' and 167a" and the third lower interconnect 155c may provide a normal current path between the third and seventh upper interconnects 167c' and 167c". Thus, even though a space between the fuses may be reduced, a laser repair yield may be greatly improved according to some embodiments of the present invention.

As briefly discussed above with respect to FIGS. 2 through 6, in some embodiments of the present invention the fuses are surrounded by a fuse guard ring. Accordingly, even though external moisture may introduced through the fuse window located over the fuses and the interlayer insulating layers exposed by the fuse window, the internal circuits adjacent to the fuses may not be damaged due to the presence of the fuse guard ring. In addition, the fuses, which are adjacent to each other, may be electrically coupled through lower interconnects formed of a non-corrosive material layer. Accordingly, even though one of the fuses may be blown through a laser repair process, another fuse adjacent to the blown fuse may not be corroded.

As briefly discussed above with respect to FIGS. 7 through 9, in further embodiments of the present invention, spaces between the fuses may be substantially increased without increased the size of the integrated circuit device. Thus, even though a laser beam may be misaligned with a selected fuse or a diameter of the laser beam is increased, a current path between interconnects electrically coupled to a non-selected fuse, which is adjacent to the selected fuse, may not be damaged. As a result, fuse regions that are suitable for a highly integrated memory device may be provided according to some embodiments of the present invention.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An integrated circuit device comprising:
    an integrated circuit substrate;
    first through fourth spaced apart lower interconnects on the integrated circuit substrate, the third and fourth spaced apart lower interconnects being parallel to the first and second lower interconnects;
    a first fuse on the first and second lower interconnects, the first fuse being between the first and second lower interconnects and electrically coupled to the first and second lower interconnects;
    a second fuse, spaced apart from the first fuse, on the third and fourth lower interconnects, the second fuse being between the third and fourth lower interconnects and electrically coupled to the third and fourth lower interconnects; and
    first, second and third intermediate interconnects on the integrated circuit substrate having surfaces that are substantially planar with surfaces of the first and second fuses, wherein the first intermediate interconnect is on the first lower interconnect and electrically coupled to the first lower interconnect, wherein the second intermediate interconnect is on the second and fourth lower interconnects and is electrically coupled to the second and fourth lower interconnects and wherein the third intermediate interconnect is on the third lower interconnect and is electrically coupled to the third lower interconnect.

2. The integrated circuit device of claim 1, further comprising first, second and third lower metal interconnects on the first, second and third intermediate interconnects, respectively, and electrically coupled to the first, second and third intermediate interconnects, respectively.

3. The integrated circuit device of claim 1, further comprising a fuse guard ring on the integrated circuit substrate that surrounds the first and second fuses.

4. The integrated circuit device of claim 3, wherein the fuse guard ring comprises:
   an intermediate interconnect guard ring between the first and second fuses and the first, second and third intermediate interconnects;
   a first metal guard ring plug on the intermediate interconnect guard ring;
   a first metal guard ring on the first metal guard ring plug;
   a second metal guard ring plug on the first metal guard ring; and
   a second metal guard ring on the second metal guard ring plug.

5. The integrated circuit device of claim 1, further comprising first, second, third and fourth fuse contact plugs, wherein the first fuse is electrically coupled to the first and second lower interconnects through the first and second fuse contact plugs and wherein the second fuse is electrically coupled to the third and fourth lower interconnects through the third and fourth fuse contact plugs.

6. The integrated circuit device of claim 5 wherein the first, second, third and fourth fuse contact plugs comprise a barrier metal layer and a metal plug layer on the barrier metal layer.

7. The integrated circuit device of claim 6 wherein the barrier metal layer comprises a titanium nitride layer.

8. The integrated circuit device of claim 1 wherein the first, second, third and fourth lower interconnects comprise non-corrosive material layers.

9. The integrated circuit device of claim 8 wherein the non-corrosive material layers comprise at least one of a polysilicon layer and a polycide layer.

10. The integrated circuit device of claim 1 wherein the first, second and third intermediate interconnects and the first and second fuses comprise tungsten layers.

* * * * *

UNITED STATES PATENT AND TRADEMARK OFFICE
CERTIFICATE OF CORRECTION

PATENT NO. : 7,180,154 B2 Page 1 of 1
APPLICATION NO. : 10/845048
DATED : February 20, 2007
INVENTOR(S) : Cho et al.

It is certified that error appears in the above-identified patent and that said Letters Patent is hereby corrected as shown below:

On Title Page,

Please correct Title to read --INTEGRATED CIRCUIT DEVICES HAVING CORROSION RESISTANT FUSE REGIONS--

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,180,154 B2  Page 1 of 1
APPLICATION NO. : 10/845048
DATED : February 20, 2007
INVENTOR(S) : Cho et al.

It is certified that error appears in the above-identified patent and that said Letters Patent is hereby corrected as shown below:

On Title Page, and Column 1, lines 1-4

Please correct Title to read --INTEGRATED CIRCUIT DEVICES HAVING CORROSION RESISTANT FUSE REGIONS--

This certificate supersedes the Certificate of Correction issued May 27, 2008.

Signed and Sealed this

Twenty-fourth Day of June, 2008

JON W. DUDAS
*Director of the United States Patent and Trademark Office*